US009859369B2

(12) United States Patent
Cheng et al.

(10) Patent No.: US 9,859,369 B2
(45) Date of Patent: Jan. 2, 2018

(54) SEMICONDUCTOR DEVICE INCLUDING NANOWIRE TRANSISTORS WITH HYBRID CHANNELS

(71) Applicant: International Business Machines Corporation, Armonk, NY (US)

(72) Inventors: Kangguo Cheng, Schenectady, NY (US); Pouya Hashemi, White Plains, NY (US); Ali Khakifirooz, San Jose, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/457,489

(22) Filed: Mar. 13, 2017

(65) Prior Publication Data

US 2017/0186841 A1 Jun. 29, 2017

Related U.S. Application Data

(62) Division of application No. 14/176,224, filed on Feb. 10, 2014, now Pat. No. 9,595,525.

(51) Int. Cl.
*H01L 21/8238* (2006.01)
*H01L 31/00* (2006.01)
(Continued)

(52) U.S. Cl.
CPC ...... *H01L 29/0673* (2013.01); *H01L 21/0262* (2013.01); *H01L 21/02236* (2013.01);
(Continued)

(58) Field of Classification Search
CPC ........... H01L 29/78696; H01L 27/1203; H01L 29/775; H01L 29/0673; H01L 29/66439;
(Continued)

(56) References Cited

U.S. PATENT DOCUMENTS 7,023,055 B2 4/2006 Ieong et al.
7,329,923 B2 2/2008 Doris et al.
(Continued)

FOREIGN PATENT DOCUMENTS

EP 1493178 1/2005
EP 1915774 4/2008
(Continued)

OTHER PUBLICATIONS

Cheng, K., et al., "High Performance Extremely Thin SOI (ETSOI) Hybrid CMOS with Si Channel NFET and Strained SiGe Channel PFET", Published in Electron Devices Meeting (IEDM), 2012 IEEE International, Date of Conference: Dec. 10-13, 2012, pp. 18.1.1-18.1.4.

(Continued)

*Primary Examiner* — Thao X Le
*Assistant Examiner* — Nduka Ojeh
(74) *Attorney, Agent, or Firm* — Scully, Scott, Murphy & Presser, P.C.; Louis J. Percello, Esq.

(57) ABSTRACT

A semiconductor device is provided that includes an n-type field effect transistor including a plurality of vertically stacked silicon-containing nanowires located in one region of a semiconductor substrate, and a p-type field effect transistor including a plurality of vertically stacked silicon germanium alloy nanowires located in another region of a semiconductor substrate. Each vertically stacked silicon-containing nanowire of the n-type field effect transistor has a different shape than the shape of each vertically stacked silicon germanium alloy nanowire of the p-type field effect transistor.

19 Claims, 6 Drawing Sheets

(51) Int. Cl.

| | |
|---|---|
| *H01L 29/06* | (2006.01) |
| *H01L 27/092* | (2006.01) |
| *H01L 29/161* | (2006.01) |
| *H01L 21/308* | (2006.01) |
| *H01L 21/02* | (2006.01) |
| *H01L 29/66* | (2006.01) |
| *H01L 29/423* | (2006.01) |
| *H01L 29/08* | (2006.01) |

(52) U.S. Cl.
CPC .... *H01L 21/02532* (2013.01); *H01L 21/3081* (2013.01); *H01L 21/823807* (2013.01); *H01L 27/092* (2013.01); *H01L 29/0847* (2013.01); *H01L 29/161* (2013.01); *H01L 29/42392* (2013.01); *H01L 29/66545* (2013.01); *H01L 21/02255* (2013.01)

(58) Field of Classification Search
CPC ............... H01L 21/84; H01L 29/42392; H01L 29/0665; H01L 29/66772; H01L 21/845; H01L 21/32; H01L 21/76205; H01L 21/0337; H01L 2221/1094; H01L 21/02603; H01L 27/0922
USPC ... 257/724, 24, 288, 347, E21.633, E27.063, 257/E29.245, E21.415, E27.112, E29.286, 257/27, 213; 438/156, 172, 199, 445
See application file for complete search history.

(56) References Cited

U.S. PATENT DOCUMENTS

| | | |
|---|---|---|
| 8,183,104 B2 | 5/2012 | Hobbs et al. |
| 8,293,608 B2 | 10/2012 | Orlowski et al. |
| 8,399,314 B2 | 3/2013 | Cohen et al. |
| 2005/0116290 A1 | 6/2005 | De Souza et al. |
| 2006/0049429 A1 | 3/2006 | Kim et al. |
| 2007/0158703 A1 | 7/2007 | Mathew et al. |
| 2007/0181972 A1 | 8/2007 | Voldman |
| 2009/0218601 A1 | 9/2009 | Stephan et al. |
| 2010/0025772 A1 | 2/2010 | Kurz et al. |
| 2011/0012090 A1 | 1/2011 | Singh et al. |
| 2011/0070734 A1* | 3/2011 | Saracco ............... B82Y 10/00 438/689 |
| 2011/0133167 A1* | 6/2011 | Bangsaruntip ........ B82Y 10/00 257/24 |
| 2012/0007052 A1* | 1/2012 | Hobbs .................. B82Y 10/00 257/24 |
| 2012/0267604 A1 | 10/2012 | Tian et al. |
| 2012/0319207 A1 | 12/2012 | Iijima |
| 2013/0270512 A1* | 10/2013 | Radosavljevic ....... H01L 21/823821 257/9 |
| 2013/0302955 A1* | 11/2013 | Vinet .................... B82Y 10/00 438/197 |
| 2014/0042386 A1* | 2/2014 | Cea ..................... H01L 29/42392 257/9 |
| 2014/0210013 A1 | 7/2014 | Kim |
| 2014/0211013 A1* | 7/2014 | Drummond ............. B60R 1/088 348/148 |
| 2014/0285980 A1* | 9/2014 | Cappellani ............. H01L 21/76 361/748 |
| 2015/0104918 A1* | 4/2015 | Liu ..................... H01L 29/42392 438/283 |

FOREIGN PATENT DOCUMENTS

| | | |
|---|---|---|
| EP | 2227836 | 9/2010 |
| EP | 2013611 | 9/2013 |
| JP | 201182509 | 4/2011 |
| WO | WO03083919 A2 | 10/2003 |
| WO | WO2006130721 A2 | 12/2006 |
| WO | WO2008027078 | 3/2008 |
| WO | WO2009083748 | 7/2009 |

OTHER PUBLICATIONS

Legoues, F.K., et al., "Oxidation studies of SiGe", Journal of Applied Physics, accepted for publication Oct. 24, 1988, 65, 1724-1728.

\* cited by examiner

SEMICONDUCTOR DEVICE INCLUDING NANOWIRE TRANSISTORS WITH HYBRID CHANNELS

BACKGROUND

The present application relates to a semiconductor device and a method of forming the same. More particularly, the present application relates to a semiconductor device including a stacked nanowire n-type field effect transistor and a stacked nanowire p-type field effect transistor located on different portions of a semiconductor substrate and a method of forming the same.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, gate-all-around semiconductor nanowire field effect transistors (FETs) is the next step in the evolution of complementary metal oxide semiconductor (CMOS) devices. Semiconductor nanowire field effect transistors (FETs) can achieve higher drive currents with increasingly smaller dimensions as compared to conventional planar FETs. In its basic form, a semiconductor nanowire FET includes a source, a drain and one or more nanowire channels between the source and the drain. A gate electrode, which wraps around the one or more nanowire channels, regulates electron flow through the nanowire channel between the source and drain.

To render semiconductor nanowire devices competitive in terms of device density, stacked semiconductor nanowire devices are typically used. In such devices, two or more semiconductor nanowires are vertically stacked one atop another. One challenge with forming stacked semiconductor nanowire CMOS devices is how to improve the nanowire device performance for p-type FET devices, without adversely affecting the nanowire device performance for the n-type FET devices.

SUMMARY

In one aspect of the present application, a semiconductor device is provided that includes an n-type field effect transistor including a plurality of vertically stacked silicon-containing nanowires located in one region of a semiconductor substrate, and a p-type field effect transistor including a plurality of vertically stacked silicon germanium alloy nanowires located in another region of a semiconductor substrate. Each vertically stacked silicon-containing nanowire of the n-type field effect transistor has a different shape than a shape of each vertically stacked silicon germanium alloy nanowire of the p-type field effect transistor. In some embodiments, a passive device can be located between the n-type field effect transistor and the p-type field effect transistor and yet in another region of the semiconductor substrate.

In another aspect of the present application, a method of forming a semiconductor device is provided. In one embodiment of the present application, the method includes providing a semiconductor-containing structure and another semiconductor-containing structure on different portions of a semiconductor substrate. In accordance with the present application, each of the semiconductor-containing structures comprises at least a first layer portion containing a first semiconductor material, a second layer portion containing a second semiconductor material that has a different etch rate than the first semiconductor material, a third layer portion containing the first semiconductor material, and a fourth layer portion containing the second semiconductor material. Next, a first hard mask is formed on exposed surfaces of the another semiconductor-containing structure, but not the semiconductor-containing structure. The first layer portion and the third layer portion are removed from the semiconductor-containing structure to provide vertically stacked semiconductor nanowires comprising the second and fourth layer portions containing the second semiconductor material. Next, the first hard mask is removed from the another semiconductor-containing structure. A second hard mask comprising an oxygen impermeable material is then formed on exposed surfaces of each of the vertically stacked semiconductor nanowires, but not the another semiconductor-containing structure. Next, a thermal condensation process is performed to convert the first layer portion, the second layer portion, the third layer portion and the fourth layer portion of the another semiconductor-containing structure into vertically stacked silicon germanium alloy nanowires that are surrounded by semiconductor oxide. The second hard mask is then removed from each of the vertically stacked semiconductor nanowires, and the semiconductor oxide is removed from each of the vertically stacked silicon germanium alloy nanowires.

In another embodiment of the present application, the method of the present application includes providing a first semiconductor-containing structure, a second semiconductor-containing structure and a third semiconductor-containing structure on different portions of a semiconductor substrate. In accordance with the present application, each of the first semiconductor-containing structure, the second semiconductor-containing structure and the third semiconductor-containing structure comprises at least a first layer portion containing a first semiconductor material, a second layer portion containing a second semiconductor material that has a different etch rate than the first semiconductor material, a third layer portion containing the first semiconductor material, and a fourth layer portion containing the second semiconductor material. Next, a first hard mask is formed on exposed surfaces of the second semiconductor-containing structure and the third semiconductor-containing structure, but not the first semiconductor-containing structure. After forming the first hard mask, the first layer portion and the third layer portion are removed from the first semiconductor-containing structure to provide vertically stacked semiconductor nanowires comprising the second and fourth layer portions containing the second semiconductor material. Next, the first hard mask is removed from the second semiconductor-containing structure and the third semiconductor-containing structure. After removing the first hard mask, a second hard mask comprising an oxygen impermeable material is formed on exposed surfaces of each of the vertically stacked semiconductor nanowires and the second semiconductor-containing structure, but not the third semiconductor-containing structure. A thermal condensation process is then performed that converts the first layer portion, the second layer portion, the third layer portion and the fourth layer portion of the second semiconductor-containing structure into a mixed first and second semiconductor material portion, and which also coverts the first layer portion, the second layer portion, the third layer portion and the fourth layer portion of the third semiconductor-containing structure into vertically stacked silicon germanium alloy nanowires that are surrounded by semiconductor oxide. After performing the thermal condensation process, the second hard mask is removed from each of the vertically stacked semiconductor nanowires and the mixed first and second semiconductor material portion, and the semiconductor oxide is also removed from each of the vertically stacked silicon germanium alloy nanowires.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
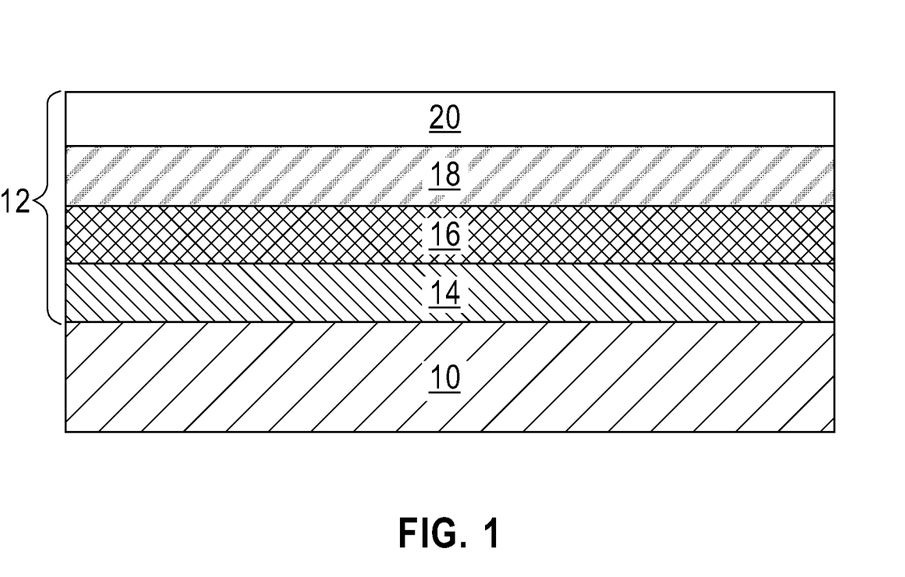
FIG. 1 is a cross sectional view of a first exemplary semiconductor structure including a semiconductor material stack located on an uppermost surface of a semiconductor substrate in accordance with an embodiment of the present application.

Referring first to FIG. 1, there is illustrated a first exemplary semiconductor structure including a semiconductor material stack 12 located on an uppermost surface of a semiconductor substrate 10 in accordance with an embodiment of the present application. The uppermost surface of the semiconductor substrate 10 is a semiconductor-containing material.

In some embodiments of the present application, the semiconductor substrate 10 can be a bulk semiconductor substrate. When a bulk semiconductor substrate is employed as semiconductor substrate 10, the bulk semiconductor substrate can be comprised of any semiconductor material including, but not limited to, Si, Ge, SiGe, SiC, SiGeC, and III/V compound semiconductors such as, for example, InAs, GaAs, and InP. Multilayers of these semiconductor materials can also be used as the semiconductor material of the bulk semiconductor. In one embodiment, the semiconductor substrate 10 can be comprised of a single crystalline semiconductor material, such as, for example, single crystalline silicon. In other embodiments, the semiconductor substrate 10 may comprise a polycrystalline or amorphous semiconductor material.

In another embodiment, a semiconductor-on-insulator (SOI) substrate (not specifically shown) can be employed as the semiconductor substrate 10. Although not specifically shown, one skilled in the art understands that an SOI substrate includes a handle substrate, a buried insulator layer located on an upper surface of the handle substrate, and a semiconductor layer located on an uppermost surface of the buried insulator layer. The handle substrate provides mechanical support for the buried insulator layer and the semiconductor layer.

The handle substrate and the semiconductor layer of the SOI substrate may comprise the same, or different, semiconductor material. The term "semiconductor" as used herein in connection with the semiconductor material of the handle substrate and the semiconductor layer denotes any semiconductor material including, for example, Si, Ge, SiGe, SiC, SiGeC, and III/V compound semiconductors such as, for example, InAs, GaAs, or InP. Multilayers of these semiconductor materials can also be used as the semiconductor material of the handle substrate and the semiconductor layer. In one embodiment, the handle substrate and the semiconductor layer are both comprised of silicon. In some embodiments, the handle substrate is a non-semiconductor material including, for example, a dielectric material and/or a conductive material. In yet other embodiments, the handle substrate can be omitted and a substrate including an insulator layer and a semiconductor layer can be used as semiconductor substrate 10.

In some embodiments, the handle substrate and the semiconductor layer may have the same or different crystal orientation. For example, the crystal orientation of the handle substrate and/or the semiconductor layer may be {100}, {110}, or {111}. Other crystallographic orientations besides those specifically mentioned can also be used in the present application. The handle substrate and/or the semiconductor layer of the SOI substrate may be a single crystalline semiconductor material, a polycrystalline material, or an amorphous material. Typically, at least the semiconductor layer is a single crystalline semiconductor material. In some embodiments, the semiconductor layer that is located atop the buried insulator layer can be processed to include semiconductor regions having different crystal orientations.

The buried insulator layer of the SOI substrate may be a crystalline or non-crystalline oxide or nitride. In one embodiment, the buried insulator layer is an oxide such as, for example, silicon dioxide. The buried insulator layer may be continuous or it may be discontinuous. When a discontinuous buried insulator region is present, the insulator region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

In one example, the thickness of the semiconductor layer of the SOI substrate can be from 100 Å to 1000 Å. In another example, the thickness of the semiconductor layer of the SOI substrate can be from 500 Å to 700 Å. In some embodiments, and when an ETSOI (extremely thin semiconductor-on-insulator) substrate is employed, the semiconductor layer of the ETSOI substrate has a thickness of less than 100 Å. If the thickness of the semiconductor layer is not within one of the above mentioned ranges, a thinning step such as, for example, planarization or etching can be used to reduce the thickness of the semiconductor layer to a value within one of the ranges mentioned above. The buried insulator layer of the SOI substrate typically has a thickness from 10 Å to 2000 Å, with a thickness from 1000 Å to 1500 Å being more typical. The thickness of the handle substrate of the SOI substrate is inconsequential to the present application.

In some other embodiments, hybrid semiconductor substrates which have different surface regions of different crystallographic orientations can be employed as semiconductor substrate 10. When a hybrid substrate is employed, an nFET is typically formed on a (100) crystal plane, while a pFET is typically formed on a (110) crystal plane. The hybrid substrate can be formed by techniques that are well known in the art. See, for example, U.S. Pat. No. 7,329,923, U.S. Publication No. 2005/0116290, dated Jun. 2, 2005 and U.S. Pat. No. 7,023,055, the entire contents of each are incorporated herein by reference.

Semiconductor substrate 10 may be doped, undoped or contain doped and undoped regions therein. For clarity, the doped regions are not specifically shown in the drawings of the present application. Each doped region within the semiconductor material of the semiconductor substrate 10 may have the same, or they may have different conductivities and/or doping concentrations. The doped regions that are present in the semiconductor material of semiconductor substrate 10 are typically referred to as well regions and they are formed utilizing a conventional ion implantation process, gas phase doping or epitaxial growth.

As stated above, the first exemplary semiconductor structure shown in FIG. 1 also includes a semiconductor material stack 12 on the uppermost surface of the semiconductor substrate 10. The semiconductor material stack 12 of the present application includes a plurality of vertically stacked layers which contain, in an alternating manner, a first semiconductor material and a second semiconductor material that has a different etch rate as compared to the first semiconductor material.

In accordance with one embodiment of the present application and as is illustrated in FIG. 1, the semiconductor material stack 12 includes, from bottom to top, a first layer 14 of a first semiconductor material, a second layer 16 of a second semiconductor material that has a different etch rate than the first semiconductor material, a third layer 18 of the first semiconductor material, and a fourth layer 20 of the second semiconductor material In other embodiments of the present application, the semiconductor material stack 12 may have three or more layers containing the first semiconductor material and three or more layers containing the second semiconductor material which layers are vertically stacked in an alternating manner one atop the other.

In addition to having a different etch rate as compared to the second semiconductor material, the first semiconductor material which can be used for providing, for example, the first and third layers 14, 18 of the semiconductor material stack 12 has a different etch rate as compared to the uppermost surface of the semiconductor substrate 10. Moreover, the various semiconductor layers of the material stack 12 are non-doped.

In one embodiment, the first semiconductor material which can be used for providing, for example, the first and third layers 14, 18 of the semiconductor material stack 12 may be a germanium-containing semiconductor material. By "germanium-containing semiconductor material" it is meant any semiconductor material that includes germanium. Examples of germanium-containing semiconductor materials that can be used as the first semiconductor material may include pure, i.e., unalloyed, germanium, or a silicon germanium alloy having a germanium content of 20 atomic percent or greater.

The second semiconductor material which can be used for providing, for example, the second and fourth layers 16, 20 of the semiconductor material stack 12 has a different etch rate as compared the first semiconductor material that is used in providing, for example, the first and third layers 14, 18 of the semiconductor material stack 12.

In one embodiment, the second semiconductor material which can be used for providing, for example, the second and fourth layers 16, 20 of the semiconductor material stack 12 may be a silicon-containing semiconductor material. By "silicon-containing semiconductor material" it is meant any semiconductor material that includes silicon. Examples of silicon-containing semiconductor materials that can be used as the first semiconductor material may include pure, i.e., unalloyed, silicon, carbon doped silicon (Si:C), or a silicon germanium alloy having a germanium content of "significantly" less germanium (i.e., 30% or more germanium content difference, to enable selective etch) than the first and third layers 14, 18 of the semiconductor material stack 12.

In one example of the structure shown in FIG. 1, the semiconductor substrate 10 may be comprised of unalloyed silicon, the first semiconductor material which can be used for providing, for example, the first and third layers 14, 18 of the semiconductor material stack 12 may be comprised of a silicon germanium alloy containing 30 atomic percent or greater germanium, and the second semiconductor material which can be used for providing, for example, the second and fourth layers 16, 20 of the semiconductor material stack 12 may be comprised of unalloyed silicon.

In some embodiments of the present application, the first and second semiconductor materials that are used in providing the various layers of the semiconductor material stack 12 may be crystalline. In other embodiments of the present application, the first and second semiconductor materials that are used in providing the various layers of the semiconductor material stack 12 may be polycrystalline. In yet other embodiments of the present application, the first and second semiconductor materials that are used in providing the various layers of the semiconductor material stack 12 may be amorphous.

The semiconductor material stack 12 including the alternating layers of the first semiconductor material and the second semiconductor material can be formed utilizing any epitaxial growth (or deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. Thus, in the present application, each layer containing the first semiconductor material and each layer containing the second semiconductor material within the semiconductor material stack 12 has an epitaxial relationship, i.e., same crystal orientation, with the underlying semiconductor material layer. Moreover, the bottommost layer of the semiconductor material stack 12, e.g., the first layer 14, has an epitaxial relationship, i.e., same crystal orientation, with the uppermost surface of the semiconductor substrate 10.

In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth process apparatuses that are suitable for use in forming each of the semiconductor materials that provide the semiconductor material stack 12 of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the various semiconductor material layers of the semiconductor material stack 12 typically ranges from 550° C. to 900° C. Although higher temperature typically results in faster deposition, the faster deposition may result in crystal defects and film cracking.

A number of different source gases may be used for the deposition of the semiconductor material stack 12. In some embodiments, the source gas for the deposition of the various semiconductor materials within the semiconductor material stack 12 include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In some embodiments, a vacuum may be broken between the epitaxial growth of each layer of different semiconductor material within the semiconductor material stack 12. In other embodiments, a vacuum may be maintained between the epitaxial growth of each layer of different semiconductor material within the semiconductor material stack 12.

Typically, the thickness of each layer (14, 16, 18, and 20) of the semiconductor material stack 12 may range from 2 nm to 100 nm. More typically, the thickness of each layer (14, 16, 18, and 20) of the semiconductor material stack 12 ranges from 5 nm to 20 nm.

As is shown in FIG. 1, each layer of semiconductor material (14, 16, 18 and 20) that provides the semiconductor material stack 12 is a contiguous layer that spans the entirety of the uppermost surface of the semiconductor substrate 10.

Figure 2:
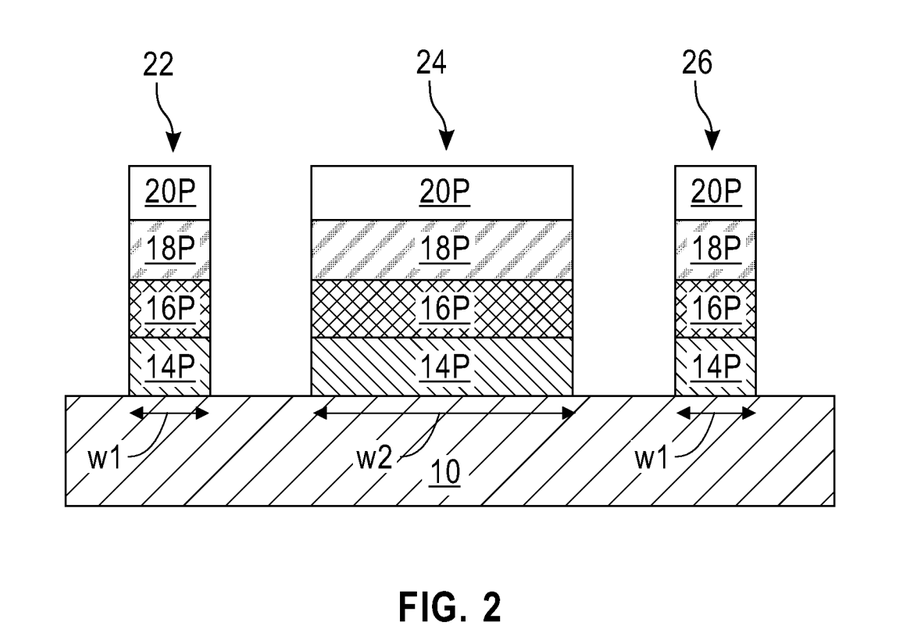
FIG. 2 is a cross sectional view of the first exemplary semiconductor structure of FIG. 1 after patterning the semiconductor material stack to form a first semiconductor-containing structure, a second semiconductor-containing structure and a third semiconductor-containing structure.

Referring now to FIG. 2, there is illustrated the first exemplary semiconductor structure of FIG. 1 after patterning the semiconductor material stack 12 to form a first semiconductor-containing structure 22, a second semiconductor-containing structure 24 and a third semiconductor-containing structure 24. Each semiconductor-containing structure 22, 24 and 26 that is formed is located on a different region of the semiconductor substrate 10 and has a bottommost surface that is in direct physical contact with a portion of the uppermost surface of the semiconductor substrate 10. In some embodiments of the present application, the second semiconductor-containing structure 24 can be omitted.

In accordance with the present application, the first semiconductor-containing structure 22 is present in a region of the semiconductor substrate 10 in which a stacked semiconductor nanowire n-type FET is to be subsequently formed, the second semiconductor-containing structure 24 is present in another region of the semiconductor substrate 10 in which a passive device will be subsequently formed, and the third semiconductor-containing structure 26 is present in yet a further region of the semiconductor substrate 10 in which a stacked semiconductor nanowire p-type FET is to be subsequently formed.

Each semiconductor-containing structure 22, 24 and 26 includes remaining portions of the semiconductor material stack 12. Thus, and in the illustrated embodiment, each semiconductor-containing structure 22, 24 and 26 includes a first layer portion 14P containing the first semiconductor material, a second layer portion 16P containing the second semiconductor material, a third layer portion 18P containing the first semiconductor material, and a fourth layer portion 20P containing the second semiconductor material. The first layer portion 14P containing the first semiconductor material, the second layer portion 16P containing the second semiconductor material, the third layer portion 18P containing the first semiconductor material, and the fourth layer portion 20P containing the second semiconductor material within each semiconductor-containing structure 22, 24, 26 have sidewalls that are vertically coincident with, i.e., vertically aligned to, each other.

In accordance with the present application, the first and third semiconductor-containing structures 22 and 26 have a width, w1, as measured from one sidewall of the semiconductor-containing structure 22 or 26 to another sidewall of the same semiconductor-containing structure 22 or 26, which is smaller than a width, w2, of the second semiconductor-containing structure 24. In one example, w1 can range from 4 nm to 20 nm, while w2 can range from 20 nm to 100 nm. In another example, w1 can range from 5 nm to 10 nm, while w2 can range from 30 nm to 50 nm.

The first exemplary semiconductor structure shown in FIG. 2 can be formed by lithography and etching. In one embodiment, a single lithography and etch process may be used. In another embodiment, two different lithography and etch processes can be employed in forming the structure shown in FIG. 2. Lithography can include forming a photoresist material (not shown) on the uppermost surface of the semiconductor material stack 12, exposing the photoresist to a desired pattern of radiation and developing the photoresist utilizing a resist developer. The etching that is used to transfer the patterned from the now patterned photoresist may include dry etching (i.e., reactive ion etching, plasma etching, ion beam etching or laser ablation) and/or a chemical wet etch process. After etching, the patterned photoresist material can be removed utilizing a stripping process such as, for example, ashing.

Figure 3A:
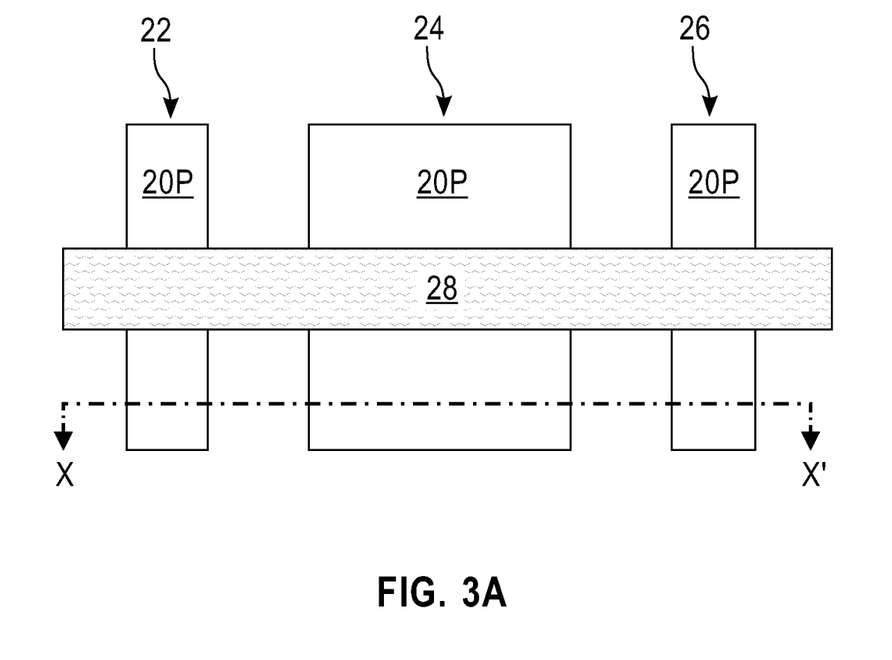
FIG. 3A is a top down view of the first exemplary semiconductor structure of FIG. 2 after forming a sacrificial gate structure straddling each of the first semiconductor-containing structure, the second semiconductor-containing structure and the third semiconductor-containing structure.
Figure 3B:
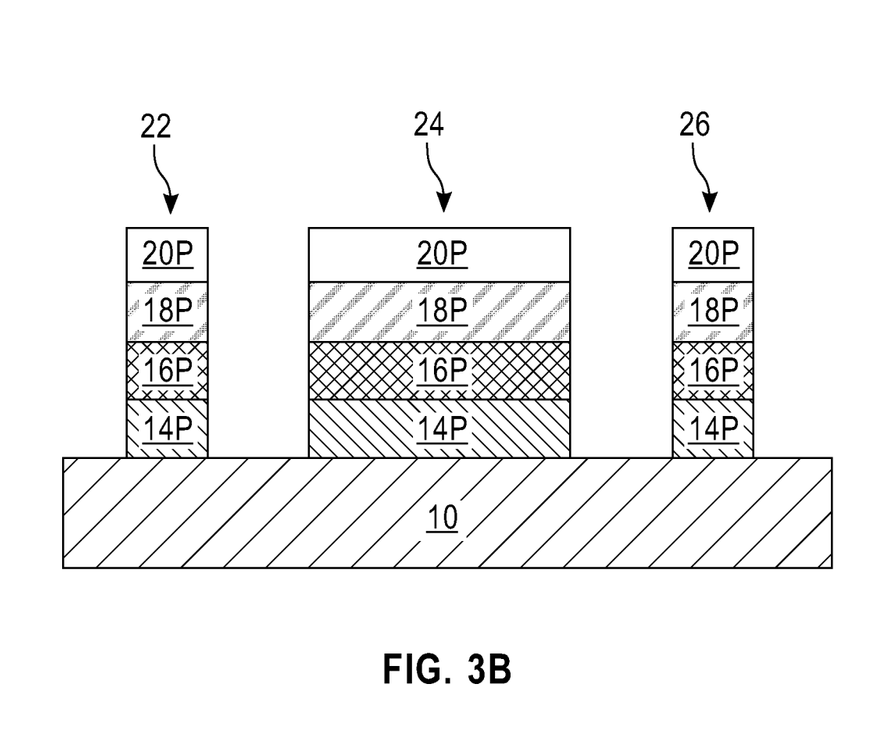
FIG. 3B is a cross sectional view of the first exemplary semiconductor structure of FIG. 3A through cross section X-X'.

Referring now to FIGS. 3A-3B, there are illustrated the first exemplary semiconductor structure of FIG. 2 after forming a sacrificial gate structure 28 straddling each of the first semiconductor-containing structure 22, the second semiconductor-containing structure 24, and the third semiconductor-containing structure 26. The sacrificial gate structure 28 serves as an anchor during the subsequent processing steps of the present application. Additionally, the sacrificial gate structure 28 may be used as a placeholder material for a subsequently provided functional gate structure. The term "functional gate structure" is used throughout the present application as a permanent gate structure used to control output current (i.e., flow of carriers in the channel) of a semiconducting device through electrical or magnetic fields.

The sacrificial gate structure 28 can be formed by first providing a blanket layer of a sacrificial gate material. The blanket layer of sacrificial gate material can be formed, for example, by chemical vapor deposition or plasma enhanced chemical vapor deposition. The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment of the present application, the blanket layer of sacrificial gate material may be composed of a metal such as, for example, Al, W, or Cu. After providing the blanket layer of sacrificial gate material, the blanket layer of sacrificial gate material can be patterned by lithography and etching so as to form the sacrificial gate structure 28.

Figure 4:
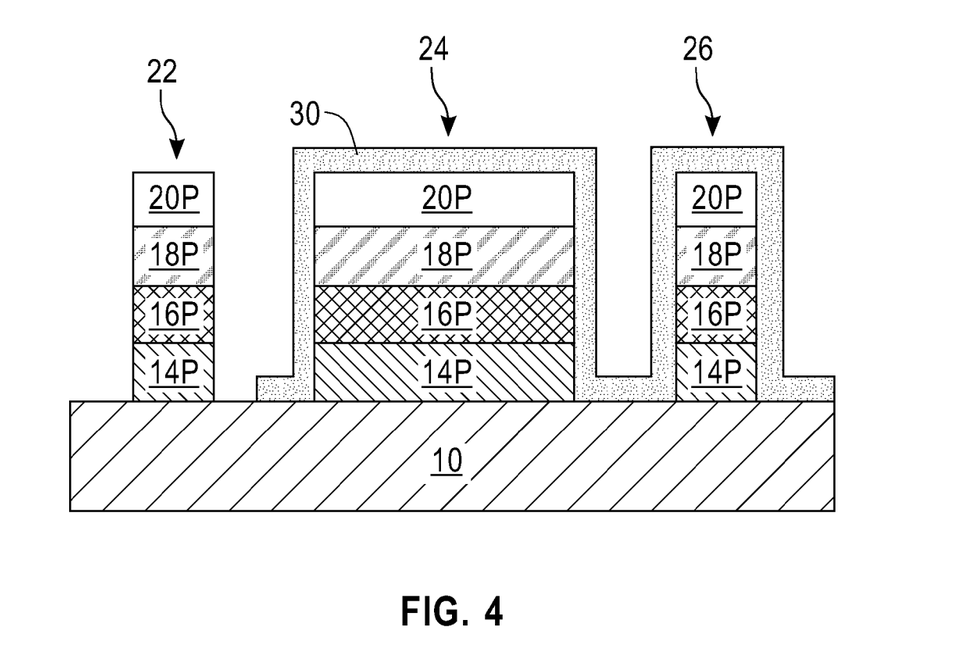
FIG. 4 is a cross sectional view of the first exemplary semiconductor structure of FIGS. 3A-3B after forming a first hard mask on exposed surfaces of the second semiconductor-containing structure and the third semiconductor-containing structure, but not the first semiconductor-containing structure.

Referring now to FIG. 4, there is illustrated the first exemplary semiconductor structure of FIGS. 3A-3B after forming a first hard mask 30 on exposed surfaces of the second semiconductor-containing structure 24 and the third semiconductor-containing structure 26, but not the first semiconductor-containing stack structure 22. Thus, and after formation of the first hard mask 30, the first semiconductor-containing structure 22 is left exposed.

The first hard mask 30 can be formed by providing a first hard mask material on all the exposed surfaces shown in FIGS. 3A-3B. The first hard mask material that can be used in providing the first hard mask 30 may include a semiconductor oxide, a semiconductor nitride and/or a semiconductor oxynitride. In one embodiment, the first hard mask material that can be used in providing the first hard mask 30 can be comprised of silicon dioxide. In another embodiment, the first hard mask material that can be used in providing the first hard mask 30 can be comprised of silicon nitride. In yet another embodiment, the first hard mask material that can be used in providing the first hard mask 30 can be a stack comprised of, in any order, silicon dioxide and silicon nitride. In some embodiments, the first hard mask material that can be used in providing the first hard mask 30 can be formed by a deposition process such as, for example, chemical vapor deposition (CVD) and plasma enhanced chemical vapor deposition (PECVD). In other embodiments, the first hard mask material that can be used in providing the first hard mask 30 can be formed by a thermal process such as, for example, thermal oxidation and/or thermal nitridation. In yet other embodiments, the first hard mask material that can be used in providing the first hard mask 30 can be formed by a combination of a deposition process and a thermal process. Typically, the first hard mask material that can be used in providing the first hard mask 30 follows the topography of the structure that it is formed upon. The thickness of the first hard mask material that can be used in providing the first hard mask 30 can range from 2 nm to 10 nm, with a thickness from 3 nm to 6 nm being more typical.

After forming the first hard mask material, the first hard mask material can be patterned by lithography and etching so as to provide the first hard mask 30. As shown in FIG. 4, the first hard mask 30 is present on the uppermost surfaces and sidewall surfaces of the second and third semiconductor-containing structures 24, 26 as well as portions of the uppermost surface of semiconductor substrate 10.

Figure 5:
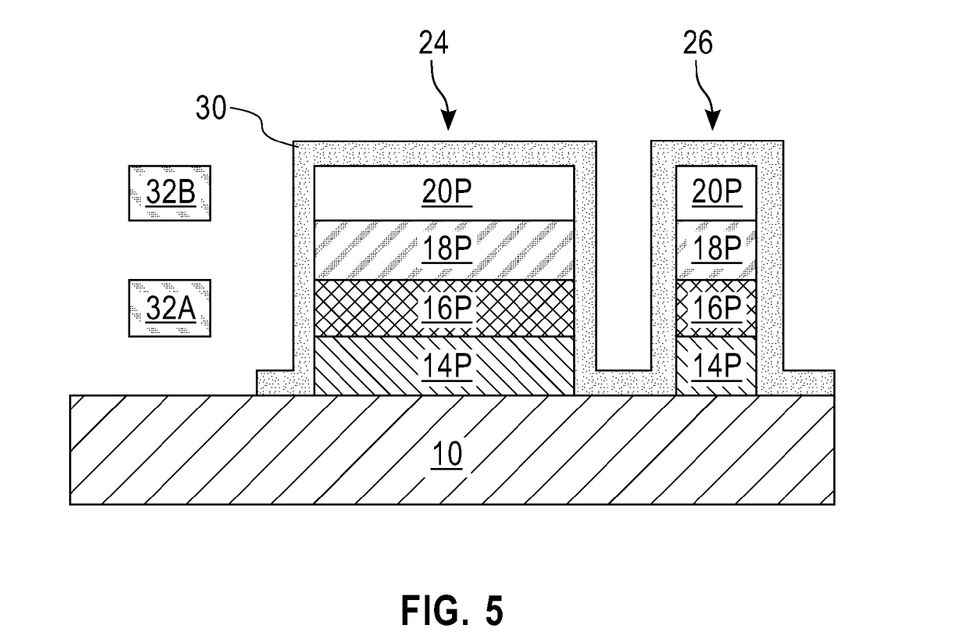
FIG. 5 is a cross sectional view of the first exemplary semiconductor structure of FIG. 4 after removing the first and third layer portions of the first semiconductor-containing structure, while maintaining the second and fourth layer portions of the first semiconductor-containing structure.

Referring now to FIG. 5, there is illustrated the first exemplary semiconductor structure of FIG. 4 after removing the first and third layer portions 14P and 18P containing the first semiconductor material from the exposed first semiconductor-containing structure 22, while maintaining the second and fourth layer portions 16P and 20P containing the second semiconductor material of the first semiconductor-containing structure 22. During this step of the present application, no layer portions are removed from the second semiconductor-containing structure 24 or the third semiconductor-containing structure 26 due to the presence of the first hard mask 30.

The remaining second layer portion 16P of the first semiconductor-containing structure 22 provides one semiconductor nanowire 32A of the n-type FET device, while the remaining fourth layer portion 20P of the first semiconductor-containing structure provides another semiconductor nanowire 32B of the n-type FET device. As is shown, the another semiconductor nanowire 32B is located above, i.e., vertically stacked atop, the semiconductor nanowire 32A. The semiconductor nanowires 32A, 32B comprise the second semiconductor material. Thus, and in accordance with an embodiment of the present application, the semiconductor nanowires 32A, 32B comprise a Si-containing semiconductor material as described above. In one embodiment, the semiconductor nanowires 32A, 32B comprise pure silicon. It is noted that the sacrificial gate material structure 28 is still present and serves to anchor the semiconductor nanowires 32A, 32B in place.

The structure shown in FIG. 5 can be formed utilizing an etch that selectively removes the first and third layer portions 14P and 18P containing the first semiconductor material from the first semiconductor-containing structure 22, while maintaining the second and fourth layer portions 16P and 20P containing the second semiconductor material of the first semiconductor-containing structure 22. In one example, and when the first and third layer portions 14P and 18P contain silicon, and the second and fourth layer portions 16P and 20P contain a silicon germanium alloy, HCl can be used to selectively remove the silicon germanium alloy material layer portions from the first semiconductor-containing structure 22.

Each semiconductor nanowire 32A, 32B has a topmost surface, a bottommost surface and four sidewall surfaces. As shown, the topmost surface of semiconductor nanowire 32A is not in direct physical contact with the bottommost surface of semiconductor nanowire 32B. Each semiconductor nanowire 32A, 32B is six sided and has a parallelepiped geometry. Moreover, each semiconductor nanowires 32A, 32B is anchored by the aforementioned sacrificial gate structure 28.

Figure 6:
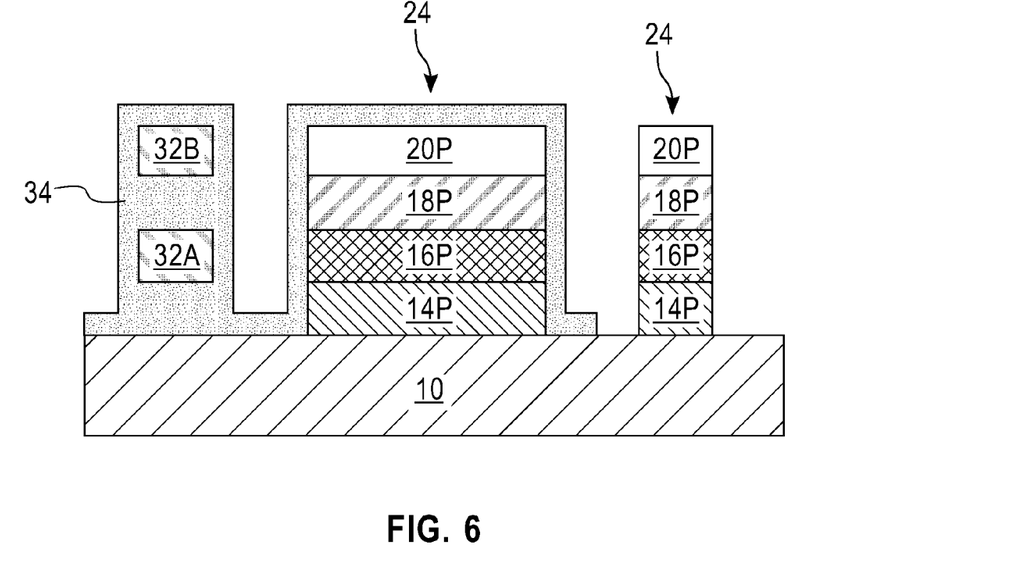
FIG. 6 is a cross sectional view of the first exemplary semiconductor structure of FIG. 5 after removing the first hard mask material, and forming a second hard mask on exposed surfaces of the remaining second and fourth layer portions of the first semiconductor-containing structure as well as the second semiconductor-containing structure, but not the third semiconductor-containing structure.

Referring now to FIG. 6, there is illustrated the first exemplary semiconductor structure of FIG. 5 after removing the first hard mask 30, and forming a second hard mask 34 on all exposed surfaces of the semiconductor nanowires 32A, 32B as well as the second semiconductor-containing structure 24, but not the third semiconductor-containing structure 26.

The first hard mask 30 can be removed by utilizing an etching process that selectively removes the hard mask material that provides the first hard mask 30 from the structure. In one embodiment, and when the first hard mask 30 comprises silicon dioxide, diluted hydrofluoric acid (HF) etch can be used. In another embodiment, and when the first hard mask 30 comprises silicon nitride, hot phosphoric acid etch can be used.

After removing the first hard mask 30, the second hard mask 34 can be formed. The second hard mask 34 that is formed at this point of the present application comprises an oxygen impermeable hard mask material. The term "oxygen impermeable" denotes any material in which oxygen does not readily diffuse therethrough. Notably, an "oxygen impermeable" material refers to a material having an oxygen diffusion rate that does not exceed 50% of the oxygen diffusion rate in silicon dioxide formed by thermal oxidation. In one embodiment, the "oxygen impermeable material" has an oxygen diffusion rate that does not exceed 10% of the oxygen diffusion rate in silicon dioxide formed by thermal oxidation. In one embodiment of the present application, the second hard mask 34 may comprise a dielectric nitride such as, for example, silicon nitride. In other embodiment of the present application, the second hard mask 34 may comprise tantalum nitride.

The second hard mask 34 can be formed by first applying a blanket layer of an oxygen impermeable hard mask material to all exposed surfaces of the structure shown in FIG. 5. The oxygen impermeable hard mask material used in providing the second hard mask 34 can be formed utilizing a deposition process including, for example, chemical vapor deposition (CVD), plasma enhanced chemical vapor deposition (PECVD), chemical solution deposition, evaporation, or physical vapor deposition (PVD). Alternatively, the oxygen impermeable hard mask material can be formed by a thermal nitridation process. In one embodiment, the oxygen impermeable hard mask material that is formed has a thickness from 5 nm to 100 nm. Other thicknesses that are greater than or lesser than the aforementioned thickness range can also be used for the thickness of the oxygen impermeable hard mask material. After forming the oxygen impermeable hard mask material, the oxygen impermeable hard mask material is subjected to patterning. That is, lithography and etching can be used in providing the second hard mask 34.

The second hard mask 34 is present on all exposed surfaces of semiconductor nanowires 32A, 32B, the uppermost surface and sidewall surfaces of the second semiconductor-containing structure 24, and on portions of the uppermost surface of semiconductor substrate 10. The third semiconductor-containing structure 26 is left exposed.

Figure 7:
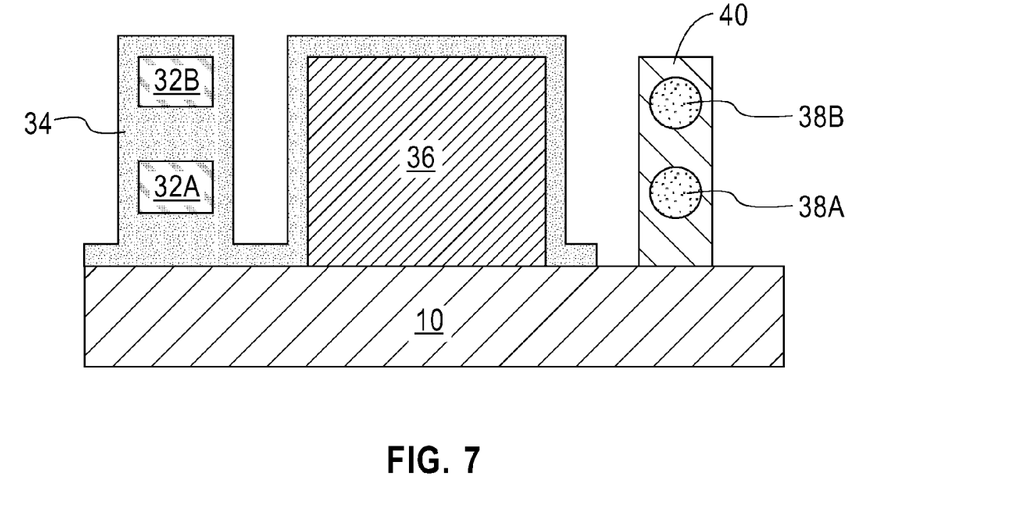
FIG. 7 is a cross sectional view of the first exemplary semiconductor structure of FIG. 6 after performing a thermal condensation process.

Referring now to FIG. 7, there is illustrated a cross sectional view of the first exemplary semiconductor structure of FIG. 6 after performing a thermal condensation process. The thermal condensation process used in the present application may also be referred to herein as a thermal oxidation process.

Since the second hard mask 34 is oxygen impermeable, no oxidation occurs during the thermal condensation process to semiconductor nanowires 32A, 32B. Moreover, and since the second hard mask 34 is oxygen impermeable, no oxidation occurs during the thermal condensation process within the layer portions that comprise the second semiconductor-containing material structure 24. Instead, and during the thermal condensation process, thermal mixing of each layer portion 14P, 16P, 18P and 20P within the second semiconductor-containing structure 24 occurs. Notably, within the second semiconductor-containing structure 24 and during thermal condensation, the first semiconductor material (i.e., germanium-containing material) that provides layer portions 14P and 18P mixes with the second semiconductor material (i.e., silicon-containing material) the provides layer portions 16P and 20P providing a first and second mixed semiconductor material portion 36. That is, this step of the present application converts the second semiconductor-containing structure 26 into a first and second mixed semiconductor material portion 36. In one embodiment, the first and second mixed semiconductor material portion 36 comprises a combination of a Si-containing material and a germanium-containing material. In one example, the first and second mixed semiconductor material portion 36 comprises a silicon germanium alloy that has a germanium content of 40 atomic percent or less. The first and second mixed semiconductor material portion 36 occupies the volume previously occupied by the layer portions 14P, 16P, 18P and 20P of the second semiconductor-containing structure 24. The first and second mixed semiconductor material portion 36 can be used in the formation of a passive device such as, for example, a gated diode.

Furthermore, and since no second hard mask 34 is present on the third semiconductor-containing structure 26, thermal oxidation occurs during the thermal condensation within the third semiconductor-containing structure 26. Notably, and within the third semiconductor-containing structure 26, the first and third layer portions 14P and 18P that contain the first semiconductor material, i.e., Ge-containing semiconductor material, oxidize at a much faster rate than the second and fourth layer portions 16P and 20P that contain the second semiconductor material, i.e., Si-containing semiconductor material. As a consequent, germanium is rejected from the first and third layer portions 14P and 18P into the second and third layer portions 16P and 20P which contain the second semiconductor material, i.e., Si-containing semiconductor material. Notably, the thermal condensation within the third semiconductor-containing structure 26 forms semiconductor nanowires 38A, 38B that are surrounded by a semiconductor oxide region 40.

The semiconductor nanowire 38A, 38B that are formed by this step of the present application have a different semiconductor composition than the previously formed semiconductor nanowires 32A, 32B. In one example, and when the previously formed semiconductor nanowires comprise silicon, semiconductor nanowires 38A, 38B that are formed during the thermal condensation process comprise a silicon germanium alloy that contains 40 atomic percent or greater germanium. Semiconductor nanowires 38A, 38B are used in forming a p-type FET. Semiconductor nanowires 38A, 38B are also anchored by the aforementioned sacrificial gate structure 28.

In one embodiment of the present application, the thermal condensation is performed at a temperature from 700° C. to 1300° C. In another embodiment of the present application, the thermal condensation is performed at a temperature from 1000° C. to 1200° C. The thermal condensation of the present application is performed in an oxidizing ambient which includes at least one oxygen-containing gas such as $O_2$, NO, $N_2O$, ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne.

The thermal condensation process of the present application may be carried out for a variable period of time. In one example, the thermal condensation process is carried out for a time period from 5 seconds to about 5 hours, depending on thermal oxidation temperature and oxidation species. In another embodiment, the thermal condensation process may be carried out for a time period from 5 minutes to about 30 minutes. The thermal condensation process of the present application may be carried out at a single targeted temperature, or various ramp and soak cycles using various ramp rates and soak times can be employed.

As shown, the semiconductor nanowires 38A, 38B are vertically stacked atop each other with semiconductor oxide material 40 located between each of the semiconductor nanowires 38A, 38B. As is shown in FIG. 7, the semiconductor nanowires 38A, 38B have a rounded, i.e., circular, geometry, and no portion of semiconductor nanowire 38A directly contacts semiconductor nanowire 32B. The semiconductor nanowires 32A, 32B, 38A and 38B that are formed in the present application are parallel to one another, and each semiconductor nanowire is suspended above the uppermost surface of semiconductor substrate 10. Moreover, more than two vertically stacked semiconductor nanowires having a parallelepiped geometry and more than two vertically stacked semiconductor nanowires having a circular geometry can be formed in the present application. The number of vertically stacked nanowires is determined by the number of semiconductor material layers in the semiconductor material stack 12.

Figure 8:
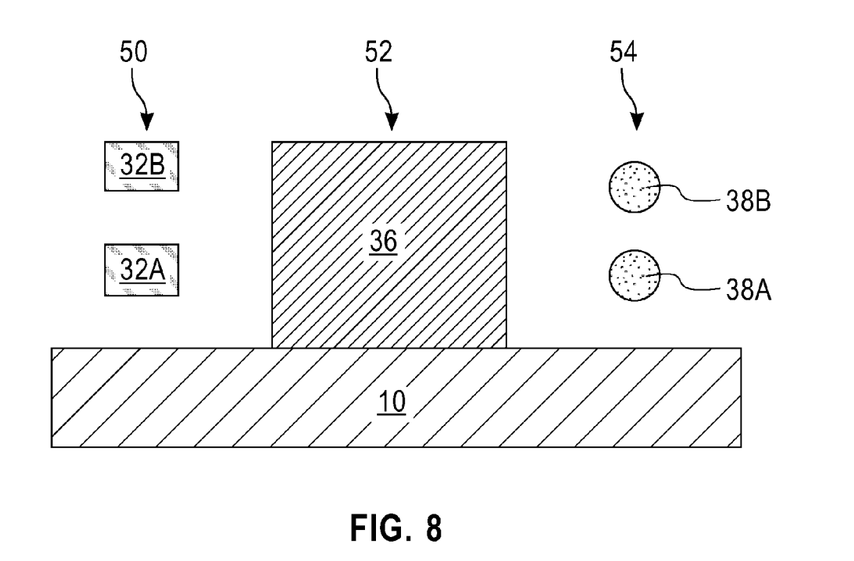
FIG. 8 is a cross sectional view of the first exemplary semiconductor structure of FIG. 7 after removing the second hard mask and a semiconductor oxide that forms during the thermal condensation process from the structure.

Referring now to FIG. 8, there is illustrated the first exemplary semiconductor structure of FIG. 7 after removing, in any order, the second hard mask 34 and the semiconductor oxide region 40 that was formed during the thermal condensation process. In this drawing, reference numeral 50 denotes the region in which an n-type FET will be subsequently formed, reference numeral 52 denotes a region in which a passive device, i.e., a gated diode, will be subsequently formed, while reference numeral 54 denotes a region in which a p-type FET will be subsequently formed.

The semiconductor oxide region 40 that surrounds the semiconductor nanowires 38A, 38B can be removed by an etch process. In one embodiment, diluted hydrofluoric acid (HF) etching can be used to the semiconductor oxide region 40 that surrounds the semiconductor nanowires 38A, 38B.

The second hard mask 34 can be removed from the structure utilizing an etching process that can selectively remove the oxygen impermeable hard mask material from the structure. In one example, hot phosphoric acid etch can be used to remove the second hard mask 34 from the structure.

Figure 9A:
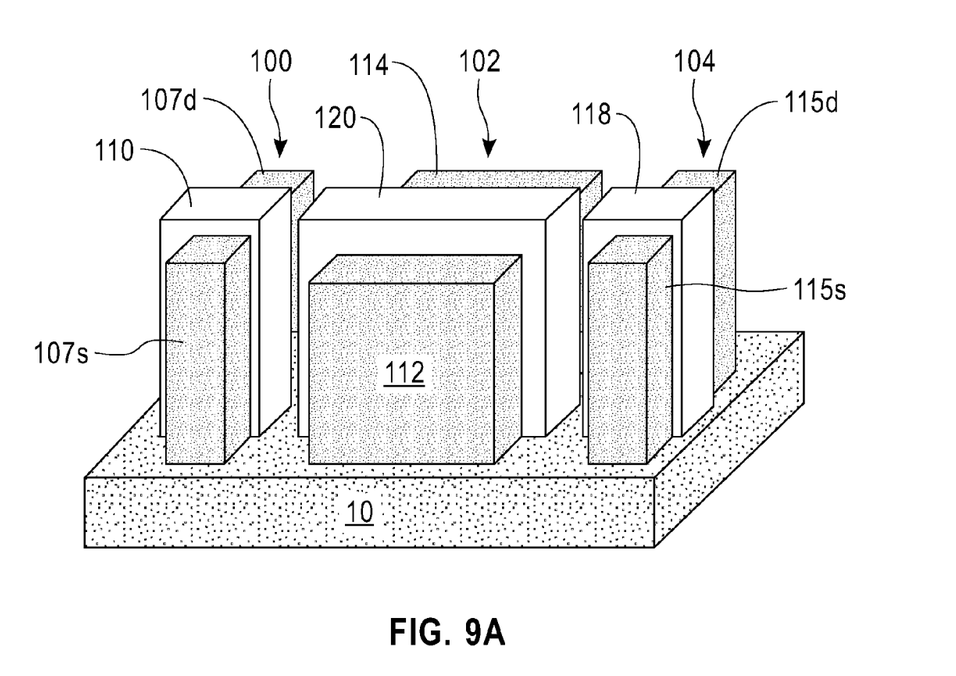
FIG. 9A is a three-dimensional structure of the first exemplary semiconductor structure of FIG. 8 after performing a CMOS flow to form a stacked semiconductor nanowire n-type FET, a passive device, and a stacked semiconductor nanowire p-type FET.

Referring now to FIG. 9A, there is illustrated a three-dimensional structure of the first exemplary semiconductor structure of FIG. 8 after performing a CMOS flow to form a stacked semiconductor nanowire n-type FET 100, a passive device 102, and a stacked semiconductor nanowire p-type FET 104. Notably, and with the sacrificial gate structure 28 still in place, exposed portions of each semiconductor nanowire 32A, 32B and each semiconductor nanowire 38A, 38B that are not covered by the sacrificial gate structure 28 are implanted with a dopant (n-type or p-type dopant as is known to those skilled in the art) forming source and drain regions (not specifically shown) within the end portions of each of the previously formed nanowires. The dopant can be introduced into each of the semiconductor nanowires by gas phase doping or ion implantation. Also, exposed portions of the first and second mixed semiconductor region 36 can be doped as this time of the present invention to provide an n-doped region and a p-doped region (both are not specifically shown in FIG. 9A) within the exposed portions of the first and second mixed semiconductor region 36.

Next, and while still maintaining the sacrificial gate structure 28 in place, an epitaxial growth process is used to merge each of the source regions and each of the drain regions forming a merge source 107s and a merged drain region 107d for the stacked semiconductor nanowire n-type FET 100, while also forming a merged source 115s and a merged drain region 115d for the stacked semiconductor nanowire p-type FET 104. As is shown, each merged source region 107s, 115s and each merged drain region 107d, 115d has a bottommost surface that is in direct physical contact with the uppermost surface of semiconductor substrate 10. Each merged source region 107s, 115s and each merged drain region 107d, 115d also has a sidewall surface that contacts a sidewall surface of the sacrificial gate structure 28. Furthermore, each merged source region 107s, 115s and each merged drain region 107d, 115d embeds the source and drain regions previously formed in each of the vertically stacked nanowires. Also, during this step, the n-doped region and the p-doped region that were previously formed into the exposed portions of the first and second mixed semiconductor region 36 are merged forming a N+ region 112 and a P+ region 114.

The merging mentioned above is provided by growing an epitaxial semiconductor material utilizing an epitaxial growth process. The epitaxial growth process that is used in merging the various regions may include one of the epitaxial methods mentioned above. The epitaxial semiconductor material that is used in merging the various regions may be the same or different than the semiconductor material of each semiconductor nanowires 32A, 32B, 38A, and 38B, and the same or different as that of the first and second mixed semiconductor region 36. A dopant can be introduced into the epitaxial semiconductor material that is used to merge the various regions together either during the epitaxial growth process itself, or following the epitaxial growth process by utilizing gas phase doping. The dopant concentration of each of the merged regions is typically from $1\times10^{20}$ atoms/cm$^3$ to $1.5\times10^{21}$ atoms/cm$^3$.

Following the epitaxial growth process, a drive in anneal can be performed to form the source/drain junctions. The drive in anneal that can be used in the present application includes any conventional anneal process that can be used in forming the source/drain junctions.

Next, the sacrificial gate structure 28 can be removed exposing a body portion of each of the semiconductor nanowires 32A, 32B, 38A, and 38B as well as a body portion of the first and second mixed semiconductor region 36. The sacrificial gate structure 28 can be removed utilizing an etch process. It is noted that the merged regions that were previously formed provide an anchoring means for each of the semiconductor nanowires 32A, 32B, 38A, and 38B after the sacrificial gate structure 28 has been removed.

After removing the sacrificial gate structure 28 and exposing the body portion of each semiconductor nanowire 32A, 32B, 38A and 38B as well as the first and second mixed semiconductor region 36, a gate structure including a gate dielectric portion and a gate conductor portion is formed in the area previously occupied by the sacrificial gate structure 28. In the region including the n-type FET, the gate dielectric portion 108 wraps around each semiconductor nanowire 32A, 32B and the gate conductor portion 110 is formed on the exposed surfaces of the gate dielectric portion 108. This is shown more clearly in FIG. 9B of the present application. In the region including the p-type FET, the gate dielectric portion 116 wraps around each semiconductor nanowire 38A, 38B and the gate conductor portion 118 is formed on the exposed surfaces of the gate dielectric portion 116. This is shown more clearly in FIG. 9C of the present application. In the exposed area including the first and second mixed semiconductor material region 36, a gate dielectric portion and a gate electrode portion 120 are formed.

Figure 9B:
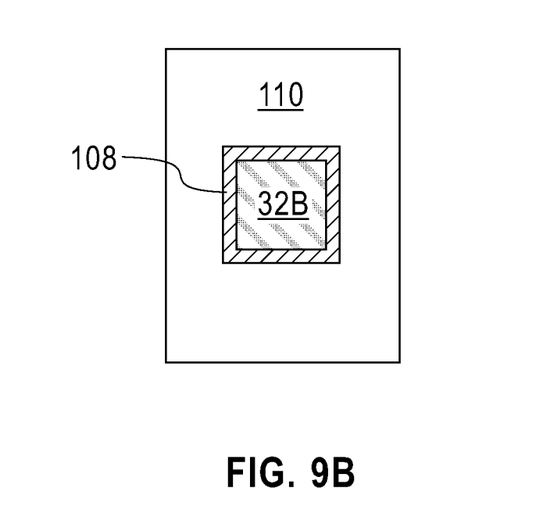
FIG. 9B is a birds eye view showing one of the semiconductor nanowires of the n-type FET including a gate dielectric portion and a gate conductor portion.
Figure 9C:
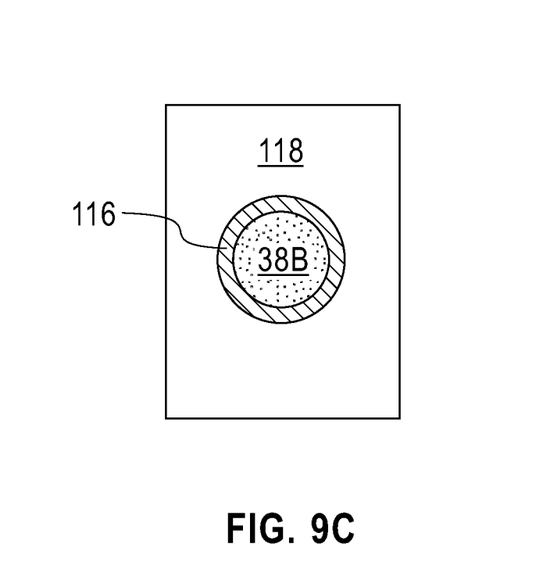
FIG. 9C is a birds eye view showing one of the semiconductor nanowires of the p-type FET including a gate dielectric portion and a gate conductor portion.

The gate dielectric material that provides the gate dielectric material portion 108, 116 can be an oxide, nitride, and/or oxynitride. In one example, the gate dielectric material that provides the gate dielectric material portion 108, 116 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed. The gate dielectric material portion for the passive device includes one of the dielectric mentioned above.

In some embodiments, the gate dielectric material portion 108 of the n-type FET 100 comprises a same gate dielectric material as the gate dielectric material portion 116 of the p-type FET 104. In other embodiments, the gate dielectric material portion 108 of the n-type FET 100 comprises a different gate dielectric material as the gate dielectric material portion 116 of the p-type FET 104.

The gate dielectric material used in providing the gate dielectric material portions 108, 116 can be formed by any deposition technique including, for example, chemical vapor deposition (CVD), plasma enhanced chemical vapor deposition (PECVD), physical vapor deposition (PVD), sputtering, or atomic layer deposition. When a different gate dielectric material is used for the gate dielectric material portions, block mask technology can be used. In one embodiment of the present application, the gate dielectric material used in providing the gate dielectric material portions 108, 116 can have a thickness in a range from 1 nm to 10 nm. Other thicknesses that are lesser than or greater than the aforementioned thickness range can also be employed for the gate dielectric material.

Each gate conductor portion 110, 120, 118 comprises a gate conductor material. In some embodiments, the gate conductor portion 110 of the n-type FET 100 comprises a same gate conductor material as the gate conductor portion 118 of the p-type FET 104. In other embodiments, the gate conductor portion 110 of the n-type FET 100 comprises a different gate conductor material as the gate conductor portion 118 of the p-type FET 104.

The gate conductor material used in providing the gate conductor material portions 110, 120, and 118 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof.

In some embodiments, the gate conductor material portion 110 may comprise an nFET gate metal, while the gate conductor material portion 118 may comprise a pFET gate metal.

The gate conductor material used in providing the gate conductor material portions 110, 120 and 118 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions, block mask technology can be used. In one embodiment, the gate conductor material used in providing the gate conductor material portions 110, 120, 118 has a thickness from 1 nm to 100 nm. Other thicknesses that are lesser than or greater than the aforementioned thickness range can also be employed for the gate conductor material.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor device comprising:
providing a first semiconductor-containing structure and another semiconductor-containing structure on different portions of a semiconductor substrate, wherein each of the semiconductor-containing structures comprises at least a first layer portion containing a first semiconductor material, a second layer portion containing a second semiconductor material that has a different etch rate than the first semiconductor material, a third layer portion containing the first semiconductor material, and a fourth layer portion containing the second semiconductor material;
forming a continuous sacrificial gate structure comprising a sacrificial gate material along sidewalls and atop each of the semiconductor-containing structures, wherein the continuous sacrificial gate structure serves as an anchoring element;
forming a first hard mask, after forming said continuous gate structure, on exposed surfaces of the another semiconductor-containing structure, but not the first semiconductor-containing structure;
removing the first layer portion and the third layer portion from the first semiconductor-containing structure to provide vertically stacked semiconductor nanowires comprising the second and fourth layer portions containing the second semiconductor material;
removing the first hard mask from the another semiconductor-containing structure;
forming a second hard mask comprising an oxygen impermeable material on exposed surfaces of each of the vertically stacked semiconductor nanowires, but not the another semiconductor-containing structure;
performing a thermal condensation process to convert the first layer portion, the second layer portion, the third layer portion and the fourth layer portion of the another semiconductor-containing structure into vertically stacked silicon germanium alloy nanowires that are surrounded by semiconductor oxide, wherein after performing the thermal condensation process the continuous sacrificial gate structure remains and anchors the vertically stacked semiconductor nanowires and the vertically stacked silicon germanium alloy nanowires; and
removing the second hard mask from each of the vertically stacked semiconductor nanowires, and the semiconductor oxide from each of the vertically stacked silicon germanium alloy nanowires.

2. The method of claim 1, wherein the first semiconductor material is a germanium-containing semiconductor material, and the second semiconductor material is a silicon-containing semiconductor material.

3. The method of claim 1, wherein each of the vertically stacked semiconductor nanowires has a parallelepiped geometry, while each of the vertically stacked silicon germanium alloy nanowires has a circular geometry.

4. The method of claim 3, further comprising removing the continuous sacrificial gate structure and forming a gate dielectric portion surrounding each of the vertically stacked semiconductor nanowires, and another gate dielectric portion surrounding each of the vertically stacked silicon germanium alloy nanowires.

5. The method of claim 4, further comprising forming a gate conductor portion of the gate dielectric portion surrounding each of the vertically stacked semiconductor nanowires, and another gate conductor portion of the another gate dielectric portion surrounding each of the vertically stacked silicon germanium alloy nanowires.

6. The method of claim 5, further comprising forming a source region in exposed portions of each of the vertically stacked silicon germanium alloy nanowires and exposed portions of each of the vertically stacked semiconductor nanowires, and a drain region in exposed portions of each of the vertically stacked silicon germanium alloy nanowires and each of the vertically stacked semiconductor nanowires, prior to removing the continuous sacrificial gate structure.

7. The method of claim 6, wherein the forming the source region and the drain region comprises merging the source regions of each of the vertically stacked silicon germanium alloy nanowires, the source regions of each of each of the vertically stacked semiconductor nanowires, the drain regions of each of the vertically stacked silicon germanium alloy nanowires, the drain regions of each of each of the vertically stacked semiconductor nanowires utilizing a epitaxial growth process.

8. The method of claim 1, wherein the thermal condensation process comprises a thermal oxidation process that is performed at a temperature from 700° C. to 1300° C. in an oxidizing ambient which comprises at least one oxygen-containing gas.

9. The method of claim 1, wherein each vertically stacked semiconductor nanowire comprises a different composition and shape than each vertically stacked silicon germanium alloy nanowire, and wherein the vertically stacked semiconductor nanowires and the vertically stacked silicon germanium alloy nanowires are both suspended above the semiconductor substrate.

10. A method of forming a semiconductor device comprising:
providing a first semiconductor-containing structure, a second semiconductor-containing structure and a third semiconductor-containing structure on different portions of a semiconductor substrate, wherein each of the first semiconductor-containing structure, the second semiconductor-containing structure and the third semiconductor-containing structure comprises at least a first layer portion containing a first semiconductor material, a second layer portion containing a second semiconductor material that has a different etch rate than the first semiconductor material, a third layer portion containing the first semiconductor material, and a fourth layer portion containing the second semiconductor material;
forming a first hard mask on exposed surfaces of the second semiconductor-containing structure and the third semiconductor-containing structure, but not the first semiconductor-containing structure;
removing the first layer portion and the third layer portion from the first semiconductor-containing structure to provide vertically stacked semiconductor nanowires comprising the second and fourth layer portions containing the second semiconductor material;
removing the first hard mask from the second semiconductor-containing structure and the third semiconductor-containing structure;
forming a second hard mask comprising an oxygen impermeable material on exposed surfaces of each of the vertically stacked semiconductor nanowires and the second semiconductor-containing structure, but not the third semiconductor-containing structure;

performing a thermal condensation process to convert the first layer portion, the second layer portion, the third layer portion and the fourth layer portion of the second semiconductor-containing structure into a mixed first and second semiconductor material portion, and to covert the first layer portion, the second layer portion, the third layer portion and the fourth layer portion of the third semiconductor-containing structure into vertically stacked silicon germanium alloy nanowires that are surrounded by semiconductor oxide; and removing the second hard mask from each of the vertically stacked semiconductor nanowires and the mixed first and second semiconductor material portion, and removing the semiconductor oxide from each of the vertically stacked silicon germanium alloy nanowires.

11. The method of claim 10, wherein the first semiconductor material is a germanium-containing semiconductor material, and the second semiconductor material is a silicon-containing semiconductor material.

12. The method of claim 10, further comprising forming a sacrificial gate structure straddling each of the semiconductor-containing structures prior to the forming the first hard mask.

13. The method of claim 10, wherein each of the vertically stacked semiconductor nanowires has a parallelepiped geometry, while each of the vertically stacked silicon germanium alloy nanowires has a circular geometry.

14. The method of claim 13, further comprising forming a gate dielectric portion surrounding each of the vertically stacked semiconductor nanowires, and another gate dielectric portion surrounding each of the vertically stacked silicon germanium alloy nanowires.

15. The method of claim 14, further comprising forming a gate conductor portion of the gate dielectric portion surrounding each of the vertically stacked semiconductor nanowires, and another gate conductor portion of the another gate dielectric portion surrounding each of the vertically stacked silicon germanium alloy nanowires.

16. The method of claim 15, further comprising forming a source region in exposed portions of each of the vertically stacked silicon germanium alloy nanowires and exposed portions of each of the vertically stacked semiconductor nanowires, and a drain region in exposed portions of each of the vertically stacked silicon germanium alloy nanowires and each of the vertically stacked semiconductor nanowires.

17. The method of claim 16, wherein the forming the source region and the drain region comprises merging the source regions of each of the vertically stacked silicon germanium alloy nanowires, the source regions of each of each of the vertically stacked semiconductor nanowires, the drain regions of each of the vertically stacked silicon germanium alloy nanowires, the drain regions of each of each of the vertically stacked semiconductor nanowires utilizing a epitaxial growth process.

18. The method of claim 10, wherein the thermal condensation process comprises a thermal oxidation process that is performed at a temperature from 700° C. to 1300° C. in an oxidizing ambient which comprises at least one oxygen-containing gas.

19. The method of claim 10, wherein each vertically stacked semiconductor nanowire comprises a different composition and shape than each vertically stacked silicon germanium alloy nanowire, and wherein the vertically stacked semiconductor nanowires and the vertically stacked silicon germanium alloy nanowires are both suspended above the semiconductor substrate, and wherein a bottommost surface of the mixed first and second semiconductor material directly contacts a topmost surface of the semiconductor substrate.

* * * * *